US012636707B2

(12) United States Patent (10) Patent No.: US 12,636,707 B2
Johnson (45) Date of Patent: May 26, 2026

(54) COATED CUTTING TOOL

(71) Applicant: AB SANDVIK COROMANT,
Sandviken (SE)

(72) Inventor: Lars Johnson, Stockholm (SE)

(73) Assignee: AB Sandvik Coromant, Sandviken
(SE)

( * ) Notice: Subject to any disclaimer, the term of this
patent is extended or adjusted under 35
U.S.C. 154(b) by 653 days.

(21) Appl. No.: 18/013,219

(22) PCT Filed: Jun. 30, 2021

(86) PCT No.: PCT/EP2021/067975
§ 371 (c)(1),
(2) Date: Dec. 27, 2022

(87) PCT Pub. No.: WO2022/003014
PCT Pub. Date: Jan. 6, 2022

(65) Prior Publication Data
US 2023/0271259 A1 Aug. 31, 2023

(30) Foreign Application Priority Data
Jul. 1, 2020 (EP) .................................... 20183487

(51) Int. Cl.
*B23B 27/14* (2006.01)
*C23C 14/02* (2006.01)
*C23C 14/06* (2006.01)
*C23C 14/32* (2006.01)

(52) U.S. Cl.
CPC .......... *B23B 27/148* (2013.01); *C23C 14/021*
(2013.01); *C23C 14/0652* (2013.01); *C23C*
*14/325* (2013.01); *B23B 2228/105* (2013.01)

(58) Field of Classification Search
None
See application file for complete search history.

(56) References Cited

U.S. PATENT DOCUMENTS

| | | | |
|---|---|---|---|
| 8,852,305 B2 | 10/2014 | Andersson et al. | |
| 9,855,608 B2 | 1/2018 | Park et al. | |
| 2012/0114436 A1 | 5/2012 | Andersson et al. | |
| 2012/0114437 A1* | 5/2012 | Andersson ............ | C23C 30/005 407/119 |
| 2014/0147683 A1* | 5/2014 | Arndt .................... | C23C 28/044 427/527 |

(Continued)

FOREIGN PATENT DOCUMENTS

| | | |
|---|---|---|
| CN | 103764873 A | 4/2014 |
| CN | 105073312 A | 11/2015 |

(Continued)

*Primary Examiner* — Seth Dumbris
(74) *Attorney, Agent, or Firm* — Corinne R. Gorski

(57) ABSTRACT

A coated cutting tool including a substrate and a coating is provided. The coating includes a nano-multilayer of alternating layers of a first nanolayer being $Ti_{1-x}Al_xN$, $0.35 \leq x \leq 0.70$, and a second nanolayer being $Ti_{1-y}Al_yN$, $0.12 \leq y \leq 0.25$. A sequence of one first nanolayer and one second nanolayer forms a layer period. The average layer period thickness in the nano-multilayer is $\leq 7$ nm. The nanomultilayer has a columnar structure with an average column width of $\leq 70$ nm.

15 Claims, 1 Drawing Sheet

(56)     References Cited

U.S. PATENT DOCUMENTS

| | | |
|---|---|---|
| 2016/0040279 A1 | 2/2016 | Setoyama et al. |
| 2018/0243837 A1* | 8/2018 | Sakurai ................. C23C 30/005 |
| 2018/0347027 A1* | 12/2018 | Kumar ................. B23B 27/148 |
| 2019/0061013 A1* | 2/2019 | Hirano ................ C23C 14/0641 |
| 2020/0376567 A1 | 12/2020 | Isaka |

FOREIGN PATENT DOCUMENTS

| | | |
|---|---|---|
| CN | 105518178 A | 4/2016 |
| EP | 2434032 A1 | 3/2012 |
| JP | 201292433 A | 5/2012 |
| WO | 2010140959 A1 | 12/2010 |
| WO | 2019098363 A1 | 5/2012 |

* cited by examiner

COATED CUTTING TOOL

RELATED APPLICATION DATA

This application is a § 371 National Stage Application of PCT International Application No. PCT/EP2021/067975 filed Jun. 30, 2021 with priority to EP 20183487.6 filed on Jul. 1, 2020.

The present invention relates to a coated cutting tool comprising a nano-multilayer of (Ti,Si)N and (Ti,Al)N.

INTRODUCTION

Nano-multilayered coatings are commonly used in the area of cutting tools for metal machining. In these coatings at least two layers which are different in some respect alternate forming a coating of a stack of nanolayers.

Metal machining operations include, for example, turning, milling, and drilling.

In order to provide a long tool life a coated cutting tool, such as an insert, should have high resistance against different types of wear, e.g., flank wear resistance, crater wear resistance, chipping resistance and flaking resistance.

Different metal machining operations affect a coated cutting tool in different ways. Turning, for example, is a continuous metal machining operation while milling is more intermittent in nature. In milling the thermal and mechanical load will vary over time.

The former induces thermal tensions which may lead to so-called thermal cracks, herein referred to as "comb cracks", in the coatings, while the later may cause fatigue in the cutting edge leading to chipping, i.e., small fragments of the cutting edge loosening from the rest of the substrate. Thus, common wear types of a coated cutting tool in milling are cracking and chipping. A high level of toughness of the coating, in particular at the cutting edge, may reduce such chipping. Increasing the comb crack resistance and edge line toughness are thus of great importance to increase tool lifetime.

There is a continuing demand for coated cutting tools in which the coating has excellent properties in terms of flank wear resistance, crater wear resistance, edge line toughness, comb crack resistance, flaking resistance, etc. in order to provide a cutting tool with superior properties than currently available cutting tools on the market. If one or more of the above-mentioned properties are improved then longer tool life is provided.

US 2012/0114436 A1 discloses quite general (Ti,Al)N/(Ti,Si)N nano-multilayered coatings. However, there is a desire to find a (Ti,Al)N/(Ti,Si)N nano-multilayered coating with especially high performance in metal machining operations.

There is an object of the present invention to provide a coated cutting tool which, at least, shows high resistance against comb cracks, high edge line toughness and high flank wear resistance.

Definitions

By the term "average layer period thickness" is meant the average thickness of a combination A-B in the nano-multilayer coating of a first nanolayer A and second nanolayer B in a nano-multilayer A-B-A-B-A . . . If the deposition process is known the calculation can be made by dividing the total thickness of the nano-multilayer by the number of A-B depositions (which corresponds to the number of revolutions when depositing a substrate in a rotating manner).

Alternatively the calculation being made by using TEM analysis of a cross-section of the nano-multilayer counting the number of consecutive A-B nanolayer combinations over a length of at least 200 nm and calculating an average value.

By the term "average column width" in the nano-multilayer is meant an average value of the crystallite columns, or "grains", in the nano-multilayer. At least a length of 500 nm, perpendicular to the growth direction of the layer, is considered and column widths are measured over this length on at least 4 different places in the nano-multilayer at a distance of 500 nm from the lower interface of the nano-multilayer.

If the nano-multilayer has a total thickness of only 0.5 μm then the measuring places are located just below the outer surface of the nano-multilayer. Suitably methods of analysis include transmission electron microscopy (TEM).

By the term "FWHM" is meant "Full Width at Half Maximum", which is the width, in degrees (2theta), of an X-ray diffraction peak at half its peak intensity (for a certain (hkl) diffraction peak).

The invention

It has now been provided a nano-multilayered coating of alternating (Ti,Si)N and (Ti,Al)N layers having a surprisingly high comb crack resistance, superior edge line toughness, at the same time the resistance to both crater wear and flank wear is high.

The present invention relates to a coated cutting tool comprising a substrate and a coating, wherein the coating comprises a nano-multilayer of alternating layers of a first nanolayer being $Ti_{1-x}Al_xN$, $0.35 \le x \le 0.70$, and a second nanolayer being $Ti_{1-y}Al_yN$, $0.12 \le y \le 0.25$, a sequence of one first nanolayer and one second nanolayer forms a layer period, the average layer period thickness in the nano-multilayer is $\le 7$ nm, the nanomultilayer has a columnar structure with an average column width of $\le 70$ nm.

For the first nanolayer $Ti_{1-x}Al_xN$, suitably $0.45 \le x \le 0.70$, preferably $0.55 \le x \le 0.65$.

For the second nanolayer $Ti_{1-y}Al_yN$, suitably $0.14 \le y \le 0.23$, preferably $0.17 \le y \le 0.21$.

The average layer period thickness of the nano-multilayer is suitably from 2 to 7 nm, preferably from 3 to 6 nm.

The average column width in the nano-multilayer is suitably ≤60 nm, preferably ≤55 nm. In a preferred embodiment the average column width in the nano-multilayer is from 5 to 60 nm, preferably from 10 to 55 nm, more preferably from 25 to 55 nm, most preferably from 30 to 45 nm.

In one embodiment, the nano-multilayer has a FWHM value for the cubic (200) peak in XRD diffraction being from 0.6 to 1.3 degrees (2theta), preferably from 0.8 to 1.2 degrees (2theta), most preferably from 0.9 to 1.1 degrees (2theta).

The (200) peak in XRD used for determining the FWHM value is Cu-$K_{a2}$ stripped.

The thickness of the nano-multilayer is suitably from about 0.5 to about 15 μm, preferably from about 1 to about 10 μm, more preferably from about 1 to about 7 μm, most preferably from about 1.5 to about 4 μm.

The nano-multilayer is suitably a cathodic arc evaporation deposited layer.

In one embodiment the coating comprises an innermost layer of TiN, (Ti,Al)N or (Cr,Al)N below the nano-multilayer closest to the substrate. Preferably, the innermost layer is (Ti,Al)N. If (Ti,Al)N is used then the (Ti,Al)N is suitably $Ti_{1-z}Al_zN$, $0.35 \le z \le 0.70$, preferably $0.45 \le z \le 0.70$. In a preferred embodiment the Ti—Al relation in the (Ti,Al)N is the same as the Ti—Al relation in the first nanolayer of the nano-multilayer. The thickness of this innermost layer can be from about 0.1 to about 2 μm, preferably from about 0.5 to about 1.5 μm.

In a preferred embodiment, the coating comprises a nano-multilayer of alternating layers of a first nanolayer being $Ti_{1-x}Al_xN$, $0.55 \leq x \leq 0.65$, and a second nanolayer being $Ti_{1-x}Al_xN$, $0.17 \leq y \leq 0.21$, the average layer period thickness of the nano-multilayer is from 3 to 6 nm, the average column width in the nano-multilayer is from 25 to 55 nm, the thickness of the nano-multilayer is from about 1 to about 7 μm, there is an innermost layer of (Ti,Al)N below the nano-multilayer closest to the substrate having a thickness of from about 0.5 to about 1.5 μm.

The substrate of the coated cutting tool can be selected from the group of cemented carbide, cermet, ceramic, cubic boron nitride and high speed steel. In one embodiment the substrate is a cemented carbide comprising from 5 to 18 wt % Co and from 0 to 10 wt % carbides nitrides or carbonitrides of group 4 to 5 in the periodic table of elements.

Further components like Cr are possible in a cemented carbide substrate,

The coated cutting tool is suitably a cutting tool insert, a drill, or a solid end-mill, for metal machining. The cutting tool insert is, for example, a turning insert or a milling insert.

BRIEF DESCRIPTIONS OF THE DRAWINGS

Figure 1:
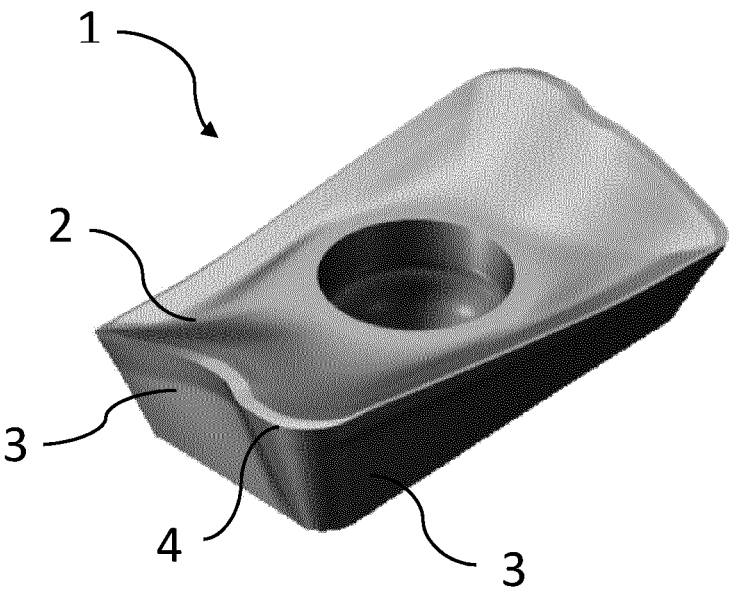
FIG. 1 shows a schematic view of one embodiment of a cutting tool being a milling insert.
Figure 2:
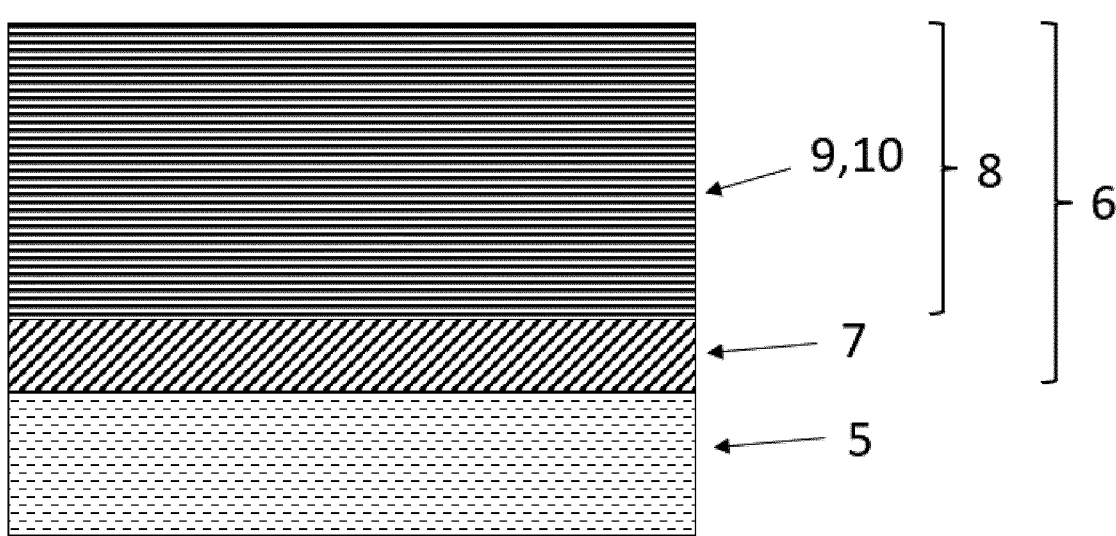
FIG. 2 shows a schematic view of a cross section of an embodiment of the coated cutting tool of the present invention showing a substrate and a coating comprising different layers.

Detailed description of embodiments in drawings FIG. 1 shows a schematic view of one embodiment of a cutting tool (1) having a rake face (2) and flank faces (3) and a cutting edge (4). The cutting tool (1) is in this embodiment a milling insert. FIG. 2 shows a schematic view of a cross section of an embodiment of the coated cutting tool of the present invention having a substrate body (5) and a coating (6). The coating consisting of a first (Ti,Al)N innermost layer (7) followed by a nano-multilayer (8) of alternating nanolayers being $Ti_{1-x}Al_xN$ (9) and nanolayers being $Ti_{1-x}Al_xN$ (10).

EXAMPLES

Example 1

Different nano-multilayers of (Ti,Si)N and (Ti,Al)N were deposited on sintered cemented carbide cutting tool insert blanks of the geometries SNMA120408, CNMG120408MM and R390-11. The composition of the cemented carbide was 10 wt % Co, 0.4 wt % Cr and rest WC. The cemented carbide blanks were coated by cathodic arc evaporation in a vacuum chamber comprising four arc flanges. Targets of Ti—Si were mounted in two of the flanges opposite each other. Targets of Ti—Al were mounted in the two remaining flanges opposite each other. The targets were circular and planar with a diameter of 100 mm available on the open market. Suitable target technology packages for arc evaporation are available from suppliers on the market such as IHI Hauzer Techno Coating B. V., Kobelco (Kobe Steel Ltd.) and Oerlikon Balzers.

The uncoated blanks were mounted on pins that undergo a three-fold rotation in the PVD chamber.

Samples 1-9:

The chamber was pumped down to high vacuum (less than $10^{-2}$ Pa) and heated to 450-550° C. by heaters located inside the chamber. The blanks were then etched for 60 minutes in an Ar plasma.

The chamber pressure (reaction pressure) was set to 4 Pa of $N_2$ gas, and a DC bias voltage of −50 V (relative to the chamber walls) was applied to the blank assembly. The cathodes were run in an arc discharge mode at a current of 150 A (each) for 75 minutes (4 flanges). A nano-multilayer coating having a thickness of about 3 μm was deposited on the blanks.

Depositions were made with combinations of Ti—Si targets being $Ti_{0.80}Si_{0.20}$, $Ti_{0.85}Si_{0.15}$ and $Ti_{0.90}Si_{0.10}$, and Ti—Al targets being $Ti_{0.75}Al_{0.25}$, $Ti_{0.60}Al_{0.40}$, $Ti_{0.50}Al_{0.50}$, and $Ti_{0.40}Al_{0.60}$. The total thickness of the deposited nano-multilayers were 3 μm. The rotational speed correlates to a certain period thickness. In order to investigate the effect of the layer period thickness in the nano-multilayer a series of depositions of blanks were made using different table rotational speeds.

Due to the target set-up two nanolayer periods are formed per revolution of the substrate table. In the equipment used the correlation between table rotational speed and nanolayer period thickness is shown in Table 1.

TABLE 1

| Table rotational speed | Estimated nanolayer period thickness* |
|---|---|
| 1 rpm | 20 nm |
| 2 rpm | 10 nm |
| 2.4 rpm | 8 nm |
| 3 rpm | 7 nm |
| 4 rpm | 5 nm |
| 5 rpm | 4 nm |

*sum of thickness of one nanolayer (Ti, Al)N and one nanolayer (Ti, Si)N

In most samples an innermost, about 1 μm thick, layer of (Ti,Al)N was deposited. In all such cases the (Ti,Al)N layer was deposited using the same content of Ti and Al in the targets as when making the (Ti,Al)N nanolayer in the above-deposited nano-multilayer. The process conditions when depositing the innermost (Ti,Al)N layer were: a chamber pressure (reaction pressure) of 4 Pa of $N_2$ gas, and a DC bias voltage of −70 V (relative to the chamber walls) applied to the blank assembly. The cathodes were run in an arc discharge mode at a current of 150 A (each).

The samples 1-12 made are listed in Table 2.

TABLE 2

| Sample | First nanolayer | Second nanolayer | Layer period | Innermost layer |
|---|---|---|---|---|
| 1 | $Ti_{0.40}Al_{0.60}N$ | $Ti_{0.80}Si_{0.20}N$ | 4 nm | — |
| 2 | $Ti_{0.40}Al_{0.60}N$ | $Ti_{0.80}Si_{0.20}N$ | 8 nm | — |
| 3 | $Ti_{0.40}Al_{0.60}N$ | $Ti_{0.80}Si_{0.20}N$ | 20 nm | — |
| 4 | $Ti_{0.40}Al_{0.60}N$ | $Ti_{0.80}Si_{0.20}N$ | 4 nm | $Ti_{0.40}Al_{0.60}N$, 1 μm |
| 5 | $Ti_{0.50}Al_{0.50}N$ | $Ti_{0.80}Si_{0.20}N$ | 4 nm | $Ti_{0.50}Al_{0.50}N$, 1 μm |
| 6 | $Ti_{0.60}Al_{0.40}N$ | $Ti_{0.80}Si_{0.20}N$ | 4 nm | $Ti_{0.60}Al_{0.40}N$, 1 μm |
| 7 | $Ti_{0.75}Al_{0.25}N$ | $Ti_{0.80}Si_{0.20}N$ | 4 nm | $Ti_{0.75}Al_{0.25}N$, 1 μm |
| 8 | $Ti_{0.40}Al_{0.60}N$ | $Ti_{0.85}Si_{0.15}N$ | 4 nm | $Ti_{0.40}Al_{0.60}N$, 1 μm |
| 9 | $Ti_{0.40}Al_{0.60}N$ | $Ti_{0.90}Si_{0.10}N$ | 4 nm | $Ti_{0.40}Al_{0.60}N$, 1 μm |
| 10 | $Ti_{0.40}Al_{0.60}N$ | $Ti_{0.80}Si_{0.20}N$ | 8 nm | $Ti_{0.40}Al_{0.60}N$, 0.2 μm |
| 11 | $Ti_{0.40}Al_{0.60}N$ | $Ti_{0.80}Si_{0.20}N$ | 8 nm | $Ti_{0.40}Al_{0.60}N$, 0.4 μm |
| 12 | $Ti_{0.40}Al_{0.60}N$ | $Ti_{0.80}Si_{0.20}N$ | 8 nm | $Ti_{0.40}Al_{0.60}N$, 0.8 μm (~1 μm) |

Samples 13-17:

Samples were further made using DC bias voltage and $N_2$ pressure combinations other than −50 V/4 Pa.

The chamber was pumped down to high vacuum (less than $10^{-2}$ Pa) and heated to 450-550° C. by heaters located inside the chamber. The blanks were then etched for 60 minutes in an Ar plasma.

An about 1 µm thick innermost layer of $Ti_{0.40}Al_{0.60}$ was first deposited. The process conditions were: a chamber pressure (reaction pressure) of 4 Pa of $N_2$ gas, and a DC bias voltage of −70 V (relative to the chamber walls) applied to the blank assembly. The cathodes were run in an arc discharge mode at a current of 150 A (each).

Then for the deposition of nano-multilayers of (Ti,Si)N and (Ti,Al)N different chamber pressures (reaction pressure) of between 2 and 6 Pa of $N_2$ gas were used, and different unipolar DC bias voltages of between −30 V and −100 V (relative to the chamber walls) were applied to the blank assembly for the different samples. The cathodes were run in an arc discharge mode at a current of 150 A (each). Nano-multilayers having a thickness of about 2 µm were deposited on the blanks, i.e., a total coating thickness of about 3 µm was provided on each insert.

Depositions were made with a combination of Ti—Si targets being $Ti_{0.80}Al_{0.20}$ and Ti—Al targets being $Ti_{0.40}Al_{0.60}$. The depositions were made using a table rotational speed of 5 rpm, i.e., giving a layer period thickness of about 4 nm in the nano-multilayer.

The samples 13-17 made are listed in Table 3.

TABLE 3

| Sample | First nanolayer | Second nanolayer | Layer period | DC bias voltage | $N_2$ pressure |
|---|---|---|---|---|---|
| 13 | $Ti_{0.40}Al_{0.60}N$ | $Ti_{0.80}Si_{0.20}N$ | 4 nm | −30 V | 4 Pa |
| 14 | $Ti_{0.40}Al_{0.60}N$ | $Ti_{0.80}Si_{0.20}N$ | 4 nm | −70 V | 4 Pa |
| 15 | $Ti_{0.40}Al_{0.60}N$ | $Ti_{0.80}Si_{0.20}N$ | 4 nm | −100 V | 4 Pa |
| 16 | $Ti_{0.40}Al_{0.60}N$ | $Ti_{0.80}Si_{0.20}N$ | 4 nm | −50 V | 2 Pa |
| 17 | $Ti_{0.40}Al_{0.60}N$ | $Ti_{0.80}Si_{0.20}N$ | 4 nm | −50 V | 6 Pa |

In order to confirm the actual elemental composition in the nano-multilayer the average composition was analysed by using energy-dispersive X-ray spectroscopy (EDS) for some samples. The EDS measurements were made over a distance comprising a number of nanolayers in SEM on a cross-section of the coating.

The result was that deviations of only 1-2 percentage units from the theoretical composition were seen. This is within the accuracy of the EDS method. It is therefore concluded that the actual elemental composition of Ti, Al and Si in the layers substantially correspond well to the respective target compositions used.

X-ray diffraction (XRD) analysis was conducted on the flank face of coated inserts using a Bruker D8 Discover diffractometer equipped with a 2D detector (VANTEC-500) and a IµS X-ray source (Cu-K$_a$, 50.0 kV, 1.0 mA) with an integrated parallel beam Montel mirror. The coated cutting tool inserts were mounted in sample holders that ensure that the flank face of the samples were parallel to the reference surface of the sample holder and also that the flank face was at appropriate height. The diffracted intensity from the coated cutting tool was measured around 20 angles where relevant peaks occur, so that at least 35° to 50° is included. Data analysis, including background subtraction and Cu-K$_{a2}$ stripping, was performed using PANalytical's X'Pert High-Score Plus software. A Pseudo-Voigt-Fit function was used for peak analysis. No thin film correction was applied to the obtained peak intensities. Possible peak overlap of a (200) peak with any diffraction peak not belonging to the PVD layer, e.g., a substrate reflection like WC, was compensated for by the software (deconvolution of combined peaks)

when determining the peak intensities and peak widths. The full width at half maximum (FWHM) value for the (200) peak of the samples was calculated. The results are shown in Table 4.

TABLE 4

| Sample | First nanolayer | Second nanolayer | Layer period | DC bias voltage | $N_2$ pressure | FWHM I(200), [°2θ] |
|---|---|---|---|---|---|---|
| 1 | $Ti_{0.40}Al_{0.60}N$ | $Ti_{0.80}Si_{0.20}N$ | 4 nm | −50 V | 4 Pa | 0.7 |
| 2 | $Ti_{0.40}Al_{0.60}N$ | $Ti_{0.80}Si_{0.20}N$ | 8 nm | −50 V | 4 Pa | — |
| 3 | $Ti_{0.40}Al_{0.60}N$ | $Ti_{0.80}Si_{0.20}N$ | 20 nm | −50 V | 4 Pa | — |
| 4 | $Ti_{0.40}Al_{0.60}N$ | $Ti_{0.80}Si_{0.20}N$ | 4 nm | −50 V | 4 Pa | 0.6 |
| 5 | $Ti_{0.50}Al_{0.50}N$ | $Ti_{0.80}Si_{0.20}N$ | 4 nm | −50 V | 4 Pa | — |
| 6 | $Ti_{0.60}Al_{0.40}N$ | $Ti_{0.80}Si_{0.20}N$ | 4 nm | −50 V | 4 Pa | — |
| 7 | $Ti_{0.75}Al_{0.25}N$ | $Ti_{0.80}Si_{0.20}N$ | 4 nm | −50 V | 4 Pa | — |
| 8 | $Ti_{0.40}Al_{0.60}N$ | $Ti_{0.85}Si_{0.15}N$ | 4 nm | −50 V | 4 Pa | — |
| 9 | $Ti_{0.40}Al_{0.60}N$ | $Ti_{0.90}Si_{0.10}N$ | 4 nm | −50 V | 4 Pa | — |
| 10 | $Ti_{0.40}Al_{0.60}N$ | $Ti_{0.80}Si_{0.20}N$ | 8 nm | −50 V | 4 Pa | — |
| 11 | $Ti_{0.40}Al_{0.60}N$ | $Ti_{0.80}Si_{0.20}N$ | 8 nm | −50 V | 4 Pa | — |
| 12 | $Ti_{0.40}Al_{0.60}N$ | $Ti_{0.80}Si_{0.20}N$ | 8 nm | −50 V | 4 Pa | — |
| 13 | $Ti_{0.40}Al_{0.60}N$ | $Ti_{0.80}Si_{0.20}N$ | 4 nm | −30 V | 4 Pa | 0.6 |
| 14 | $Ti_{0.40}Al_{0.60}N$ | $Ti_{0.80}Si_{0.20}N$ | 4 nm | −70 V | 4 Pa | 0.7 |
| 15 | $Ti_{0.40}Al_{0.60}N$ | $Ti_{0.80}Si_{0.20}N$ | 4 nm | −100 V | 4 Pa | 1.0 |
| 16 | $Ti_{0.40}Al_{0.60}N$ | $Ti_{0.80}Si_{0.20}N$ | 4 nm | −50 V | 2 Pa | 0.7 |
| 17 | $Ti_{0.40}Al_{0.60}N$ | $Ti_{0.80}Si_{0.20}N$ | 4 nm | −50 V | 6 Pa | 0.6 |

Example 2

Cutting tests were made in order to determine the performance of the samples made.

Explanations to Terms Used:

The following expressions/terms are commonly used in metal cutting, but nevertheless explained in the table below:

| | |
|---|---|
| Vc (m/min): | cutting speed in meters per minute |
| fz (mm/tooth): | feed rate in millimeter per tooth (in milling) |
| fn (mm/rev) | feed rate per revolution (in turning) |
| z: (number) | number of teeth in the cutter |
| $a_e$ (mm): | radial depth of cut in millimeter |
| $a_p$ (mm): | axial depth of cut in millimeter |

Comb Crack Resistance:

Operation: Shoulder milling
Tool holder: R245-080027-12M, Dc = 80 mm
Work piece material: Toolox 33 (tool steel), L = 600 mm,
I = 200 mm, h = 100 mm, Insert type: R390-11
Cutting speed $V_c$ = 320 m/min
Feed rate $f_z$ = 0.3 mm/rev
Depth of cut $a_p$ = 2 mm
Radial engagement $a_e$ = 15 mm
with cutting fluid The criteria for end of tool life is a max. chipped height VB>0.3 mm.

Edge Line Toughness:

Work piece material: Dievar unhardened, P3. 0.Z.AN, z = 1
$V_c$ = 200 m/min
$f_z$ = 0.20 mm
$a_e$ = 12 mm
$a_p$ = 3.0
length of cut = 12 mm
without cutting fluid The cut-off criteria are chipping of at least 0.5 mm of the edge line or a measured depth of 0.2 mm at either the flankor the rake phase. Tool life is presented as the number of cut entrances in order to achieve these criteria.

Flank Wear Test:

Longitudinal turning

---

Work piece material: Sverker 21 (tool steel),

Hardness ~210HB, D = 180, L = 700 mm, $V_c$ = 125 m/min $f_n$ = 0.072 mm/rev $a_p$ = 2 mm without cutting fluid

---

The cut-off criteria for tool life is a flank wear VB of 0.15 mm.

Flaking Resistance:

The evaluation was made through turning test in austenitic steel. In order to provoke adhesive wear and flaking of the coating the depth of cut $a_p$ was varied between 4 to 0 and 0 to 4 mm (in one run during radial facing). The inserts were evaluated through SEM analysis.

Operation: Facing (turning)

---

Work piece material: Bar of austenitic stainless steel

Sanmac 316L, L = 200 mm, D = 100 mm, ~215 HB

Insert type: CNMG 120408-MM

Cooling: yes

Depth of cut $a_p$ = 4 to 0, 0 to 4 mm

Cutting speed $V_c$ = 140 m/min

Feed rate $f_z$ = 0.36 mm/rev

---

Layer Period Thickness:

TABLE 5

| Sample | Layer period | Comb crack resistance (No. cuts) | Flaking resistance (flaked area, mm²) |
|---|---|---|---|
| 1 | 4 nm | 30 | 0.06 |
| 2 | 8 nm | 23 | 0.06 |
| 3 | 20 nm | 21 | 0.09 |

Table 5 shows that in terms of flaking resistance the thickest layer period, 20 nm, showed the worst performance.

Furthermore, from the test results (sample 1, sample 2, sample 3) it is seen that out of the tested layer periods 4 nm (5 rpm), 8 nm (2.4 rpm) and 20 nm (1 rpm), the best result in comb crack resistance, 30 cuts until cut-off criteria is seen for the layer period 4 nm. When the layer period is 8 nm the comb crack resistance result is 23 cuts and when the layer period is 20 nm the comb crack resistance result is 21 cuts. A result of less than 25 minutes is considered insufficient. Thus, the lower the layer period the better the result. Thus, a suitable range of an average layer period of the nano-multilayer is considered to be from 2 to 7 nm, preferably from 3 to 6 nm.

Effect of innermost layer:

Samples having a deposited nano-multilayer of $Ti_{0.40}Al_{0.60}N/Ti_{0.80}Al_{0.20}$ (target composition) were tested with or without any additional innermost layer directly on the substrate.

TABLE 6

| Sample | Innermost layer | Layer period | Comb crack resistance (No. cuts) | Edge line toughness (No. cuts) |
|---|---|---|---|---|
| 1 | — | 4 nm | 30 | not tested |
| 4 | $Ti_{0.40}Al_{0.60}N$, 1 μm | 4 nm | 39 | 43 |

The result in comb crack resistance is improved by the presence of an innermost additional (Ti,Al)N layer.

Even though there was no ELT testing for the sample without any additional innermost layer, table 7 shows at least the effect of the thickness of an additional innermost layer in terms of ELT. The samples in table 7 are outside the invention in terms of layer period thickness 8 nm. However, the impact on ELT for a variation in layer thickness on the innermost layer is regarded to follow the same direction also for a layer period lower than 8 nm, i.e., within the present invention.

TABLE 7

| Sample | Innermost layer | Layer period | Edge line toughness (No. cuts) |
|---|---|---|---|
| 10 | $Ti_{0.40}Al_{0.60}N$, 0.2 μm | 8 nm | 11 |
| 11 | $Ti_{0.40}Al_{0.60}N$, 0.4 μm | 8 nm | 15 |
| 12 | $Ti_{0.40}Al_{0.60}N$, 0.8 μm (~1 μm) | 8 nm | 29 |

ELT is considered to improve by the presence of an innermost additional (Ti,Al)N layer. When comparing innermost layers of 0.2, 0.4 and 0.8 μm thickness, 0.8 μm thickness gave better performance than the thinner ones.

Ti/Al Relation in (Ti,Al)N Nanolayer:

TABLE 8

| Sample | First nanolayer | Second nanolayer | Comb crack resistance (No. cuts) | Edge line toughness (No. cuts) |
|---|---|---|---|---|
| 4 | $Ti_{0.40}Al_{0.60}N$ | $Ti_{0.80}Si_{0.20}N$ | 39 | 43 |
| 5 | $Ti_{0.50}Al_{0.50}N$ | $Ti_{0.80}Si_{0.20}N$ | 36 | 19 |
| 6 | $Ti_{0.60}Al_{0.40}N$ | $Ti_{0.80}Si_{0.20}N$ | 33 | 9 |
| 7 | $Ti_{0.75}Al_{0.25}N$ | $Ti_{0.80}Si_{0.20}N$ | 19 | 12 |

From the test results it is seen that the best result in comb crack resistance, 39 cuts until cut-off criteria is seen for sample 4 ($Ti_{0.40}Al_{0.25}$). For sample 7 ($Ti_{0.75}Al_{0.25}$) the comb crack resistance result is only 19 cuts. A result of less than 25 cuts is considered insufficient. Thus, all of sample 4 ($Ti_{0.40}Al_{0.60}$), sample 5 ($Ti_{0.50}Al_{0.50}$) and sample 6 ($Ti_{0.60}Al_{0.40}$) showed good performance in the comb crack resistance test. Thus, a required range of Al the (Ti,Al)N sublayer composition in the nano-multilayer is considered to be $Ti_{1-x}Al_xN$, $0.35 \leq x \leq 0.70$ in terms of good comb crack resistance.

However, when ELT performance is taken into account sample 6 with $Ti_{0.60}Al_{0.40}N/Ti_{0.40}Si_{0.20}N$ performs bad. The best performance in both of comb crack resistance and edge line toughness was sample 4 with $Ti_{0.40}Al_{0.60}N/Ti_{0.40}Al_{0.20}$.

A suitable Al content range is therefore $0.45 \leq x \leq 0.70$ and a preferred one $0.55 \leq x \leq 0.65$.

Ti/Si Relation in (Ti,Si)N Nanolayer:

TABLE 9

| Sample | First nanolayer | Second nanolayer | Comb crack resistance (No. cuts) | Edge line toughness (No. cuts) | Flank wear resistance (minutes) |
|---|---|---|---|---|---|
| 4 | $Ti_{0.40}Al_{0.60}N$ | $Ti_{0.80}Si_{0.20}N$ | 39 | 43 | 21.3 |
| 8 | $Ti_{0.40}Al_{0.60}N$ | $Ti_{0.85}Si_{0.15}N$ | 27 | 11 | 17.7 |
| 9 | $Ti_{0.40}Al_{0.60}N$ | $Ti_{0.90}Si_{0.10}N$ | 25 | 15 | 13.5 |

Regarding comb crack resistance, sample 8 ($Ti_{0.40}Al_{0.60}N/Ti_{0.85}Al_{0.15}N$), run at 5 rpm, 50 V, 4 Pa, shows a quite good result in comb crack resistance, 27 cuts until cut-off criteria. Also, the flank wear resistance is good (17.7 minutes). However, in terms of edge line toughness the result is unsatisfactory. Sample 9 ($Ti_{0.40}Al_{0.60}N/Ti_{0.90}Al_{0.10}N$), run at 5 rpm, 50 V, 4 Pa) also shows a quite good result in comb crack resistance, 25 cuts until cut-off criteria. However, the flank wear resistance is completely unsatisfactory (13.5 minutes) and also the edge line toughness (15 cuts) is unsatisfactory.

The best performance in all of comb crack resistance, edge line toughness and flank wear was sample 4 with ($Ti_{0.40}Al_{0.60}N/Ti_{0.60}Si_{0.20}N$). The second best is sample 8 with ($Ti_{0.40}Al_{0.60}N/Ti_{0.85}Si_{0.15}N$) while sample 9 with ($Ti_{0.40}Al_{0.60}N/Ti_{0.90}Si_{0.10}N$) is regarded as unsatisfactory.

Thus, a required working range of Si content in the (Ti,Si)N sublayer in the nano-multilayer is considered to be $Ti_{1-y}Si_yN$, $0.12 \leq y \leq 0.25$. Suitably $0.14 \leq y \leq 0.23$ and preferably $0.17 \leq y \leq 0.21$.

A too high Si content in the (Ti,Si)N sublayer is expected to decrease the toughness (ELT) of the nano-multilayer.

Grain size, FWHM:

Exceptional results in an edge line toughness (ELT) test (number of cuts) are seen for samples in which the nano-multilayer has been deposited using a certain level of DC bias voltage and/or $N_2$ pressure. From the test results of sample 4 (–50 V, 4 Pa), sample 13 (–30 V, 4 Pa), sample 14 (–70 V, 4 Pa), sample 15 (–100 V, 4 Pa), sample 16 (–50 V, 2 Pa), and sample 17 (–50 V, 6 Pa) it is seen that coatings deposited at 4 Pa $N_2$ pressure give very excellent ELT results for DC bias voltage levels used of at least –70 V, with –100 V even better (sample 14 and sample 15). For coatings deposited at 2 Pa $N_2$ pressure excellent ELT results are provided for DC bias voltages used already at –50 V (sample 16). Startlayer about 1 μm. Thickness of nano-multilayer about 2 μm.

TABLE 10

| | DC bias voltage | $N_2$ pressure | Edge line toughness (No. cuts) | Comb crack resistance (No. cuts) | Column width (nm) | FWHM, TiAlN [200] (degrees 2theta) |
|---|---|---|---|---|---|---|
| 4 | –50 V | 4 Pa | 43 | 39 | 54 | 0.6 |
| 13 | –30 V | 4 Pa | 34 | 37 | — | 0.6 |
| 14 | –70 V | 4 Pa | 83 | 29 | 50 | 0.7 |
| 15 | –100 V | 4 Pa | 99 | 31 | 37 | 1.0 |
| 16 | –50 V | 2 Pa | 94 | 34 | — | 0.7 |
| 17 | 50 V | 6 Pa | 39 | 39 | — | 0.6 |

For the samples having excellent ELT results, (sample 14 (–70 V, 4 Pa), sample 15 (–100 V, 4 Pa), and sample 16 (–50 V, 2 Pa), the comb crack test results were excellent as well (29, 31 and 34 cuts, respectively).

Thus, in order to provide coatings with the best edge line toughness the bias voltage-pressure relation in the deposition process is concluded to be either using a DC bias voltage of from –65 to –125 V at a $N_2$ pressure of from 3 to 6 Pa, or, using a DC bias voltage of from –30 to –75 V at a $N_2$ pressure of from 1 to 3 Pa.

It is seen from sample 4 (–50 V, 4 Pa), sample 13 (–70 V, 4 Pa), and sample 15 (–100 V, 4 Pa), that a higher DC bias voltage used gives a lower grain size (average column width) in the nano-multilayer (–50V gives 54 nm, –70 V gives 50 nm and –100 V gives 37 nm). The lower grain size is also reflected in a higher FWHM value. Thus, a range of an average column width in the nano-multilayer is considered to be suitably s 70 nm, preferably s 55 nm. The lower limit is considered to be suitably 5 nm, preferably 10 nm, more preferably 25 nm. A most preferred range is considered to be from 30 to 45 nm.

The invention claimed is:

1. A coated cutting tool comprising:
   a substrate; and
   a coating, wherein the coating comprises a nano-multilayer of alternating layers of a first nanolayer being $Ti_{1-x}Al_xN$, $0.35 \leq x \leq 0.70$, and a second nanolayer being $Ti_{1-y}Al_yN$, $0.12 \leq y \leq 0.25$, a sequence of one first nanolayer and one second nanolayer forming a layer period, wherein an average layer period thickness in the nano-multilayer is $\leq 7$ nm, the nano-multilayer having a columnar structure with an average column width of $\leq 70$ nm, and wherein a FWHM value for a cubic (200) peak in X-ray diffraction is from 0.6 to 1.2 degrees (2theta).

2. The coated cutting tool according to claim 1, wherein for the first nanolayer $Ti_{1-x}Al_xN$, $0.45 \leq x \leq 0.70$.

3. The coated cutting tool according to claim 1, wherein for the second nanolayer $Ti_{1-y}Al_yN$, $0.14 \leq y \leq 0.23$.

4. The coated cutting tool according to claim 1, wherein the average layer period thickness in the nano-multilayer is from 2 to 7 nm.

5. The coated cutting tool according to claim 1, wherein the nano-multilayer has an average column width of $\leq 55$ nm.

6. The coated cutting tool according to claim 1, wherein the nano-multilayer has an average column width of 30 to 45 nm.

7. The coated cutting tool according to claim 1, wherein the FWHM value for cubic (200) peak in X-ray diffraction is from 0.8 to 1.2 degrees (2theta).

8. The coated cutting tool according to claim 1, wherein a thickness of the nano-multilayer is from about 0.5 to about 15 μm.

9. The coated cutting tool according to claim 1, wherein a thickness of the nano-multilayer is from about 1 to about 7 μm.

10. The coated cutting tool according to claim 1, wherein the coating includes an innermost layer of TiN, (Ti,Al)N or (Cr,Al)N below the nano-multilayer closest to the substrate having a thickness of from about 0.1 to about 2 μm.

11. The coated cutting tool according to claim 10, wherein the innermost layer is $Ti_{1-z}Al_zN$, $0.35 \leq z \leq 0.70$.

12. The coated cutting tool according to claim 1, wherein the nano-multilayer is a cathodic arc evaporation deposited layer.

13. The coated cutting tool according to claim 1, wherein the substrate of the coated cutting tool is selected from the group of cemented carbide, cermet, ceramic, cubic boron nitride and high speed steel.

14. The coated cutting tool according to claim 1, wherein the coated cutting tool is a cutting tool insert, a drill, or a solid end-mill, for metal machining.

15. The coated cutting tool according to claim 1, wherein the FWHM value for the cubic (200) peak in X-ray diffraction is from 0.7 to 1.1 degrees (2theta).

\* \* \* \* \*